United States Patent [19]
Hatozaki

[11] Patent Number: 5,414,616
[45] Date of Patent: May 9, 1995

[54] INVERTER WITH REDUCED WIRING INDUCTANCE AND INCREASED CURRENT BALANCE BETWEEN SEMICONDUCTOR SWITCHING ELEMENTS

[75] Inventor: Yoshihisa Hatozaki, Kawasaki, Japan
[73] Assignee: Fuji Electric Co., Ltd., Kanagawa, Japan
[21] Appl. No.: 187,019
[22] Filed: Jan. 26, 1994
[30] Foreign Application Priority Data
  Jan. 28, 1993 [JP] Japan .................. 5-032819
[51] Int. Cl.⁶ ........................................ H02M 7/5387
[52] U.S. Cl. ...................................................... 363/132
[58] Field of Search ............................. 363/132, 144

[56] References Cited
U.S. PATENT DOCUMENTS

| | | | |
|---|---|---|---|
| 4,816,984 | 3/1989 | Porst et al. | 363/132 X |
| 5,055,990 | 10/1991 | Miki et al. | 363/132 X |
| 5,170,337 | 12/1992 | Borowiec et al. | 363/132 X |

FOREIGN PATENT DOCUMENTS
59-153476A 9/1984 Japan .

Primary Examiner—Steven L. Stephan
Assistant Examiner—E. To
Attorney, Agent, or Firm—Spencer, Frank & Schneider

[57] ABSTRACT

In an inverter device, two short-circuiting bars of a direct current circuit portion are each formed of a conducting plate bent so as to have a crank-shaped cross section, one of the outside flat surfaces of each of the two conducting plates is connected to the input end of each semiconductor switching element, and the other outside flat surfaces of the respective conducting plates are superimposed on each other, in close proximity, via an insulating sheet. This construction reduces the difference in wiring inductance between the closest element to and the farthest element from a smoothing capacitor when the device is turned on, and also decreases the current imbalance between them.

4 Claims, 12 Drawing Sheets

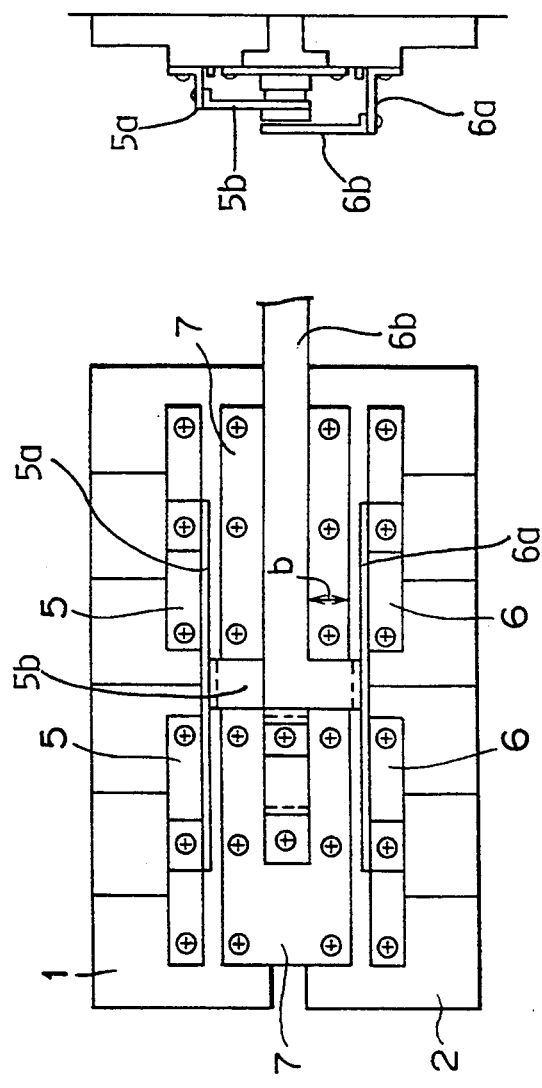
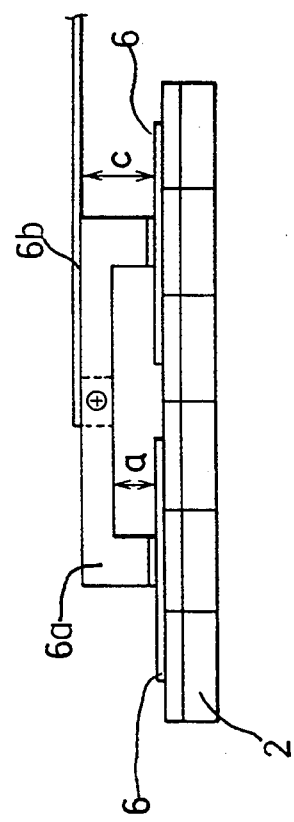
FIG. 5A (PRIOR ART)
FIG. 5B (PRIOR ART)
FIG. 5C (PRIOR ART)

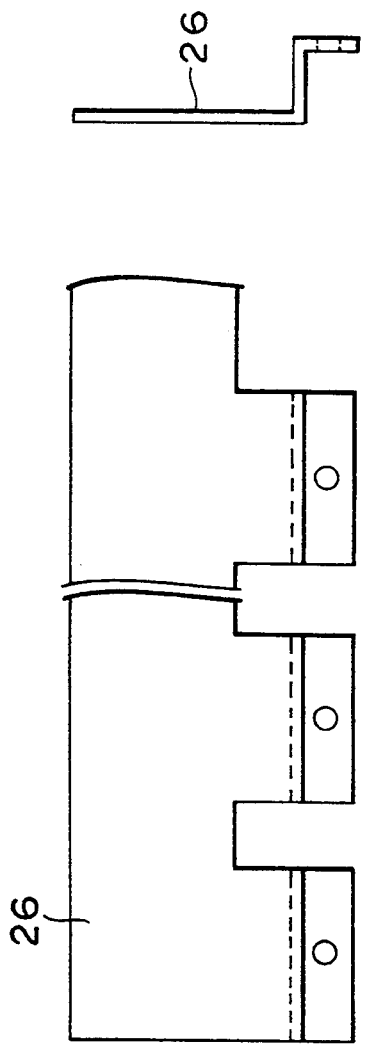
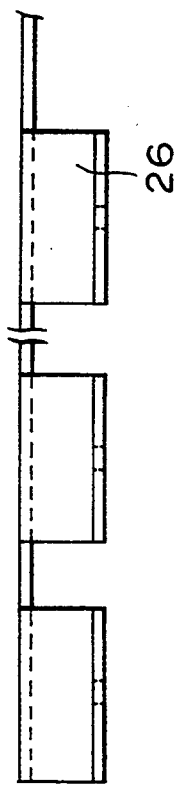
FIG.16C
FIG.16B
FIG.16A

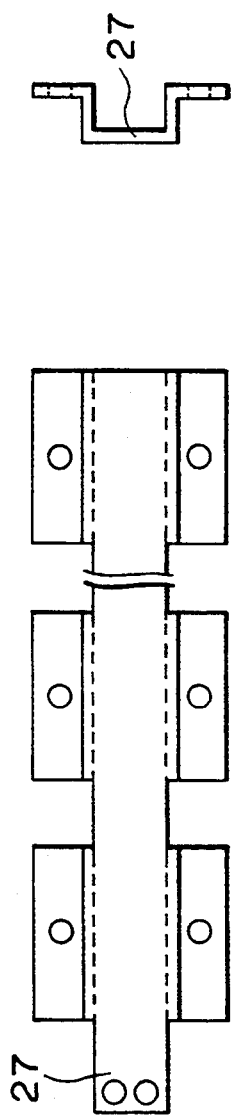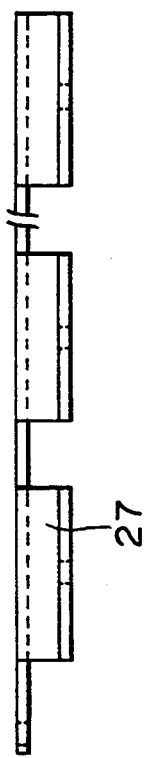
FIG.17C
FIG.17B
FIG.17A

INVERTER WITH REDUCED WIRING INDUCTANCE AND INCREASED CURRENT BALANCE BETWEEN SEMICONDUCTOR SWITCHING ELEMENTS

BACKGROUND OF THE INVENTION

1. Field of the Invention

The present invention relates to a large-capacity inverter device comprising a plurality of parallel-connected semiconductor switching elements and a smoothing capacitor arranged beside them.

2. Description of the Prior Art

A conventional inverter device of this type has a bridge circuit in each constituent phase, the upper arm and the lower arm of the bridge circuit comprising a plurality of semiconductor switching elements connected in parallel. FIG. 1 shows the construction of one of the phases. Respective input ends of semiconductor switching elements 1 for an upper arm are connected by a positive-side short-circuiting bar 5 to the positive pole of a smoothing capacitor 3. Similarly, input ends of semiconductor switching elements 2 for a lower arm are connected by a negative-side short-circuiting bar 6 to the negative pole of the smoothing capacitor 3.

Respective output ends of the elements 1, 2 are connected to an output-side short-circuiting bar 7, and then make outputs to the outside from an output terminal at the other end of the short-circuiting bar 7.

FIG. 2 shows the directions of current flow by arrows when the device illustrated in FIG. 1 is turned on. The arrows on the one-dot chain line indicate overall current flow, while the arrows on the broken lines indicate shunted current flow across the respective elements.

FIGS. 3 and 4 are front and plan views, respectively, showing examples of the arrangement of the components of the above-described inverter device. As illustrated in these drawings, semiconductor switching elements 1 for an upper arm and semiconductor switching elements 2 for a lower arm are each disposed in parallel connection on a cooling member 4, and a smoothing capacitor 3 is arranged laterally virtually on the longitudinal extension of the parallelly disposed elements 1, 2.

The so arranged elements 1, 2 and the smoothing capacitor 3 are connected together by short-circuiting bars as shown in FIGS. 5A, 5B, 5C and 6. In these drawings, the short-circuiting bars are wired in a tree-like fashion so that the distance between each element 1 or 2 and the smoothing capacitor 3 in a direct current circuit may be equal.

More particularly, the arranged elements 1 and the smoothing capacitor 3 are connected together by two (first) short-circuiting bars 5, a second short-circuiting bar 5a, and a third short-circuiting bar 5b. The short-circuiting bars 5, 5a, and 5b are wired in a tree-like fashion so that the distance between each element 1 and the smoothing capacitor 3 in a direct current circuit may be equal.

Also, the arranged elements 2 and the smoothing capacitor 3 are connected together by two (first) short-circuiting bars 6, a second short-circuiting bar 6a, and a third short-circuiting bar 6b. The short-circuiting bars 6, 6a and 6b are wired in a tree-like fashion so that the distance between each element 2 and the smoothing capacitor 3 in a direct current circuit may be equal. As indicated by arrows in FIG. 6, currents flow across the tree-like wiring bar structure comprised of the short-circuiting bars 5, 5a, and 5b and 6, 6a, and 6b in opposite directions to each other, and wiring inductance between each element 1 or 2 and the smoothing capacitor 3 becomes non-uniform. Therefore, when elements 1, 2 are turned on, an imbalance of current arises because of the difference in wiring inductance. In other words, when current flows in the direction of arrows as shown in FIG. 6, wiring inductances transiently constitute resistances, thus forming some elements with a high flowability of current and some other elements with a low flowability of current. Furthermore, the tree-like wiring bar structure poses the problem that it is complicated, requires a large number of parts which are difficult to assemble, involves high cost, and attends to be unstable in quantity.

The occurrence of imbalance in current necessitates the selection of the capacities of the elements 1, 2 based on the maximum value of current. The expected excessive increase in capacity induces higher costs, and the larger element capacities require larger dimensions. Furthermore, the range of applying the rated capacity of the inverter is restricted, since the maximum capacity is reduced.

In regard to the above problem associated with wiring inductance, the influence of offsetting of wiring inductance may be decreased by increasing the distances a, b, and c between the respective current paths shown in FIGS. 5A, 5B and 5C. In this case as well, the dimensions would be increased to an unnecessary extent, thus leading to an oversize of the device. Furthermore, the tree-like wiring bar structure poses the problem that it is complicated, requires a large number of parts which are difficult to assemble, involves high costs, and tends to be unstable in quality.

SUMMARY OF THE INVENTION

This invention has been accomplished to solve the above-described problems, and its object is to provide a low-priced, high-performance, small-sized inverter device.

To achieve this object, a first aspect of the present invention is to provide an inverter device comprising:

a plurality of semiconductor switching elements connected in parallel in each phase to constitute an upper arm and a lower arm of a bridge circuit, a smoothing capacitor disposed laterally in proximity to the longitudinal extension of the parallel-arranged semiconductor switching elements, a direct current circuit portion comprising short-circuiting bars connecting both ends of the smoothing capacitor to the input ends of the respective semiconductor switching elements, and an output circuit portion comprising a short-circuiting bar connecting the output ends of the semiconductor switching elements to an output terminal; wherein the two short-circuiting bars of the direct current circuit portion are each formed of a conducting plate bent so as to have a crank-shaped cross section, one of the outside flat surfaces of each of the two conducting plates is connected to the input end of each semiconductor switching element, and the other outside flat surfaces of the respective conducting plates superimposed on each other, in close proximity, via an insulator.

In this first aspect of the present invention, the two short-circuiting bars of the direct current circuit portion are each formed of a conducting plate bent so as to have a crank-shaped cross section, one of the outside flat surfaces of each of the two conducting plates is connected to the input end of each semiconductor switching element, and the other out side flat surfaces of the respective conducting plates are superimposed on each other, in close proximity via an insulator. This contrivance reduces the difference in wiring inductance between the closest element to and the farthest element from the smoothing capacitor when the device is turned on, and also decreases the current imbalance between them.

A second aspect of the invention is to provide the above-mentioned inverter device in which the short-circuiting bar of the output circuit portion is extended to the side opposite to the side where the smoothing capacitor is located, and the extended end of the short-circuiting bar is inverted and bent upwards, and the short-circuiting bar of the output circuit portion and the two short-circuiting bars of the direct current circuit portion are closely disposed parallel to each other with insulators therebetween.

In this second aspect of the invention, the short-circuiting bar of the output circuit portion is extended to the side opposite to the side where the smoothing capacitor is located, and the extended end of the short-circuiting bar is inverted and bent upwards, and the short-circuiting bar of the output circuit portion and the two short-circuiting bars of the direct current circuit portion are closely disposed parallel to each other with insulators therebetween. This construction makes the wiring distance of each element equal, and makes the short-circuiting bar of the output circuit portion close to the two short-circuiting bars of the direct current circuit portion, thus uniformly offsetting the wiring inductance of each element.

In detail, the current that has flowed from the positive side is distributed to each element of the upper arm. The sum of the current flowing through the positive side short-circuiting bar between the respective elements, and the current flowing through the output side short-circuiting bar between the respective elements is always the total current volume. An output bar is arranged in close proximity to the positive side short-circuiting bar and the output side short-circuiting bar with insulators therebetween so that those two types of currents may flow to the side opposite to the positive input position while approaching in the same direction, and make a U-turn there, whereafter the output bar may flow the total current volume in a direction reverse to the flow through each element. Thus, the wiring inductance is offset, and the absolute value of wiring inductance is lowered.

A third aspect of the invention is to provide the inverter device of the first or second aspect of the invention in which those portions of the short-circuiting bars excluding their junctions to the semiconductor switching elements are notched in the width direction, whereby the short-circuiting bars are formed in a comb-like shape.

In this third aspect of the invention, those portions of the short-circuiting bars excluding their junctions to the semiconductor switching elements are notched in the width direction, whereby the short-circuiting bars are formed in a comb-like shape. Hence, currents are concentrated in the middle of the short-circuiting bars, so that the wiring inductance is offset more effectively.

The above and other objects, effects, features and advantages of the present invention will become more apparent from the following description of embodiments thereof taken in conjunction with the accompanying drawings.

BRIEF DESCRIPTION OF THE DRAWINGS

FIG. 5A is a plan view showing the construction of the conventional inverter device;

FIG. 5B is a side view showing the construction of the conventional inverter device;

FIG. 5C is a front view showing the construction of the conventional inverter device;

FIG. 16A is a front view of one of the short-circuiting bars used in the device illustrated in FIG. 14;

FIG. 16B is a plan view of the short-circuiting bar used in the device illustrated in FIG. 14;

FIG. 16C is a side view of the short-circuiting bar used in the device illustrated in FIG. 14;

FIG. 17A is a plan view of the other short-circuiting bar used in the device illustrated in FIG. 14;

FIG. 17B is a plan view of the other short-circuiting bar used in the device illustrated in FIG. 14; and FIG. 17C is a side view of the other short-circuiting bar used in the device illustrated in FIG. 14.

DETAILED DESCRIPTION OF PREFERRED EMBODIMENTS

Embodiment 1

Figure 1:
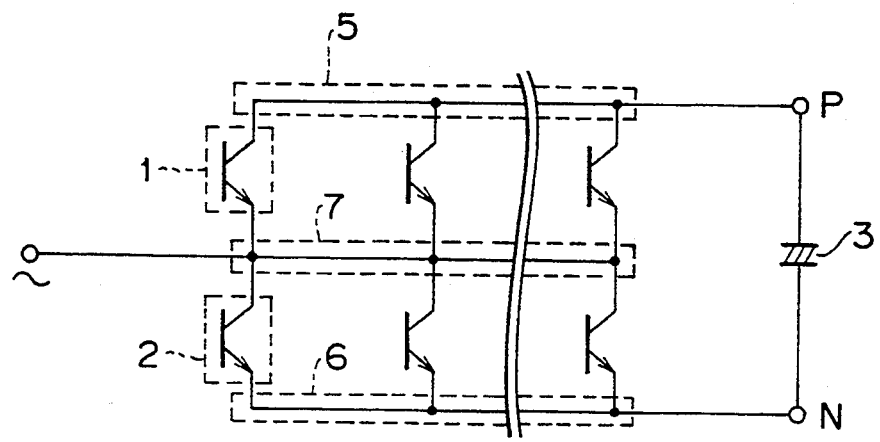
FIG. 1 is a circuit diagram showing the construction of the essential part of a conventional inverter device.
Figure 2:
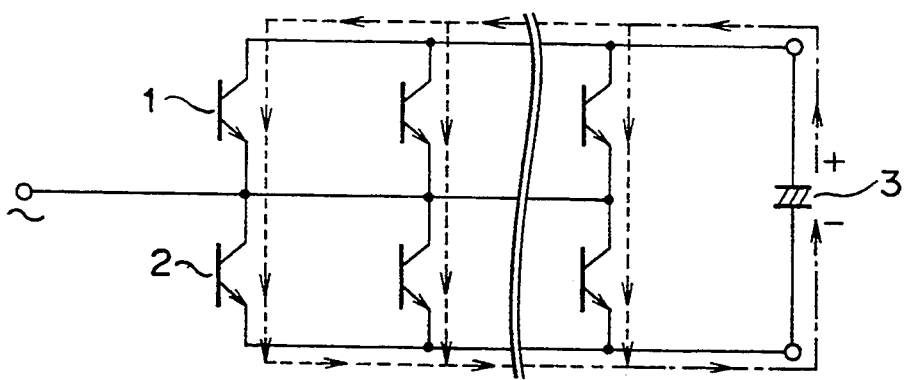
FIG. 2 is a circuit diagram showing the actions of the essential part of the conventional inverter device.
Figure 3:
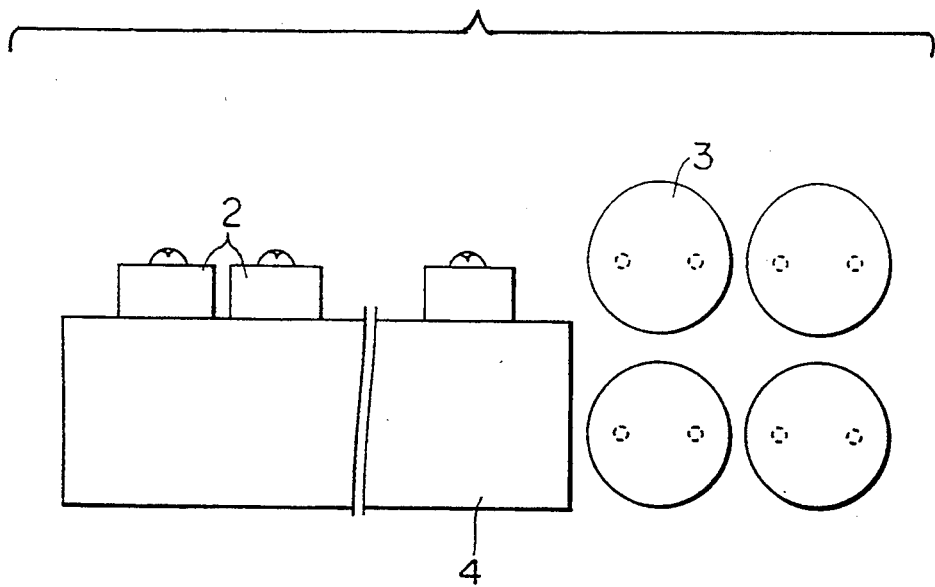
FIG. 3 is a front view showing the arrangement of the components of the conventional inverter device.
Figure 4:
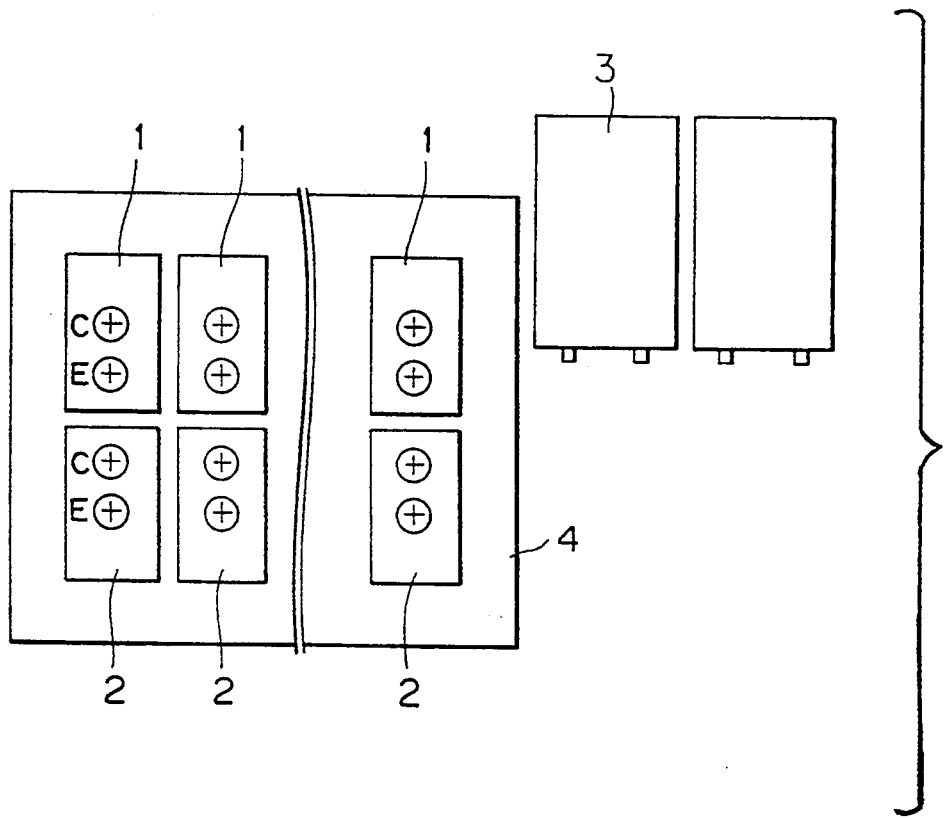
FIG. 4 is a plan view showing the arrangement of the components of the conventional inverter device.
Figure 6:
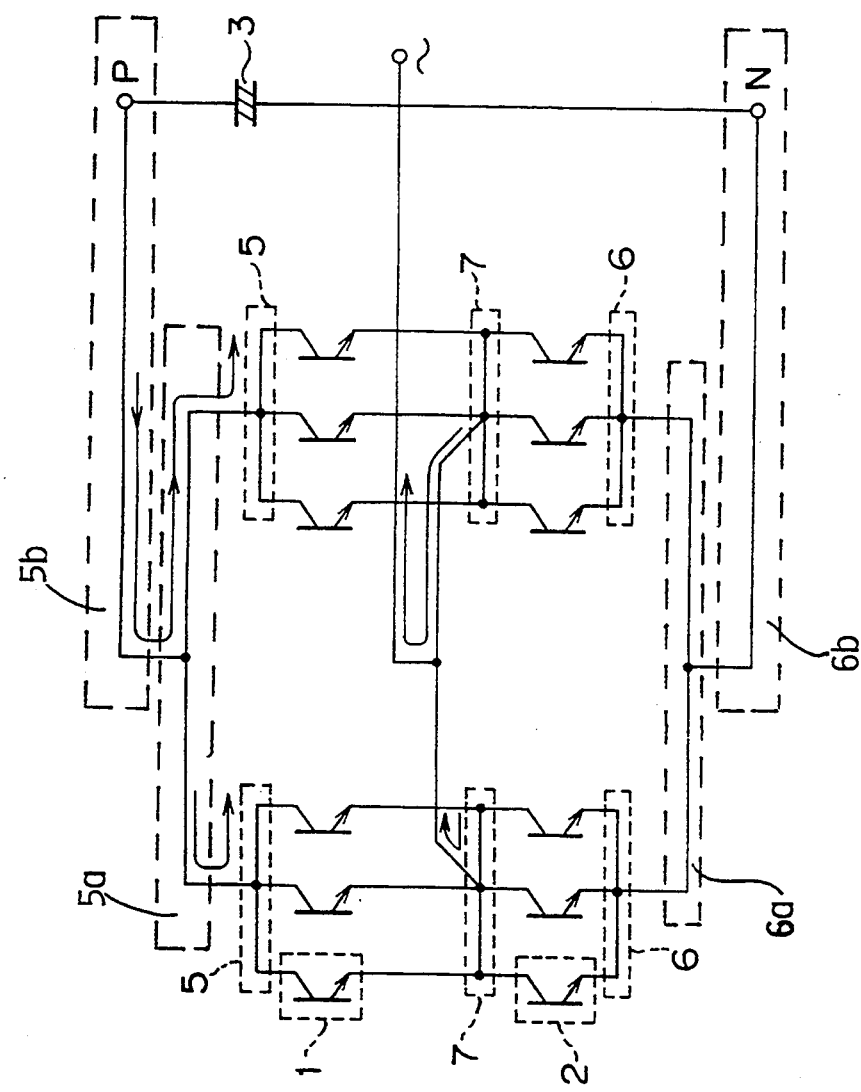
FIG. 6 is a circuit diagram showing the actions of the conventional inverter device.
Figure 7:
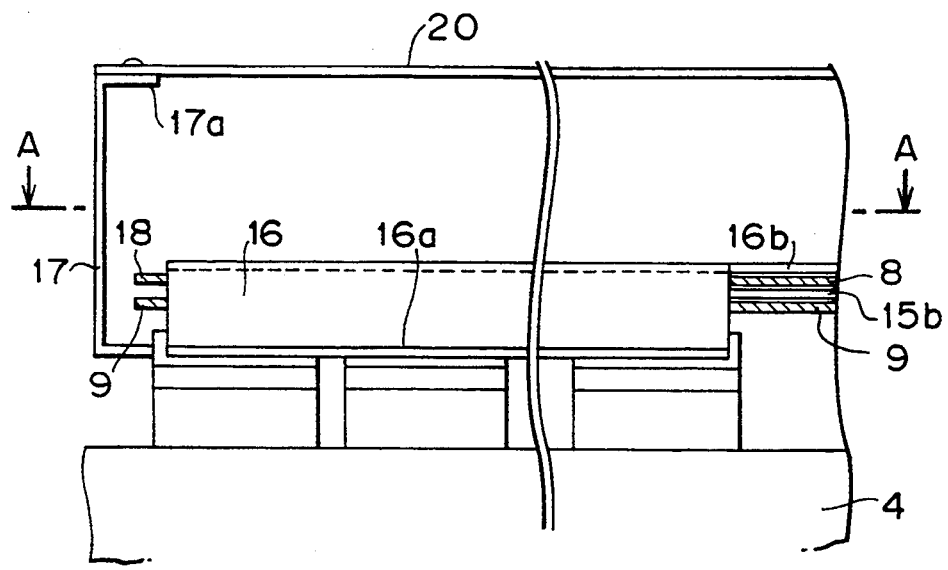
FIG. 7 is a front view of an inverter device as an embodiment of the first aspect of the present invention.
Figure 8:
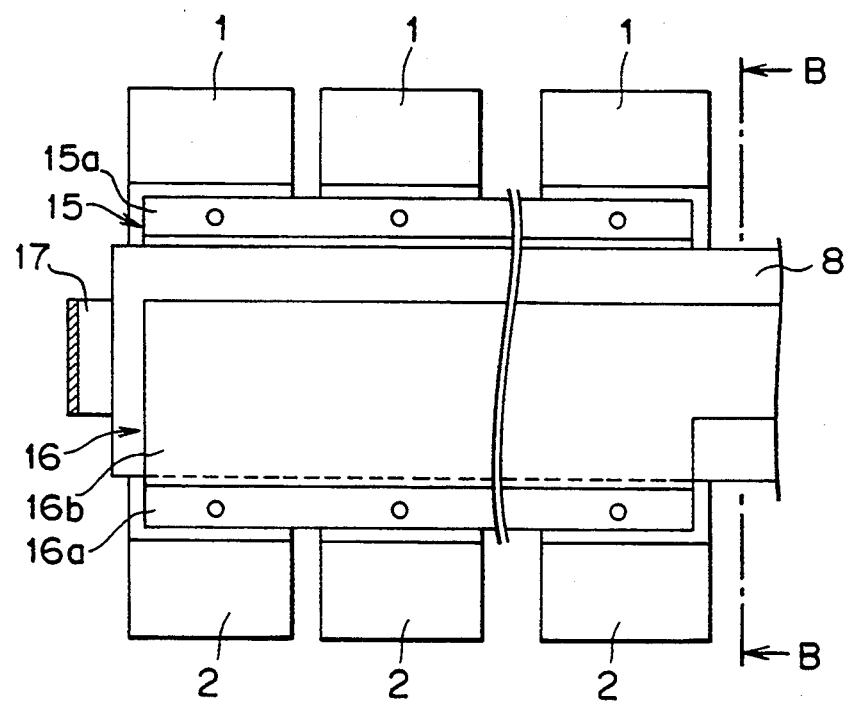
FIG. 8 is a sectional view taken along the line A—A of FIG. 7.
Figure 9:
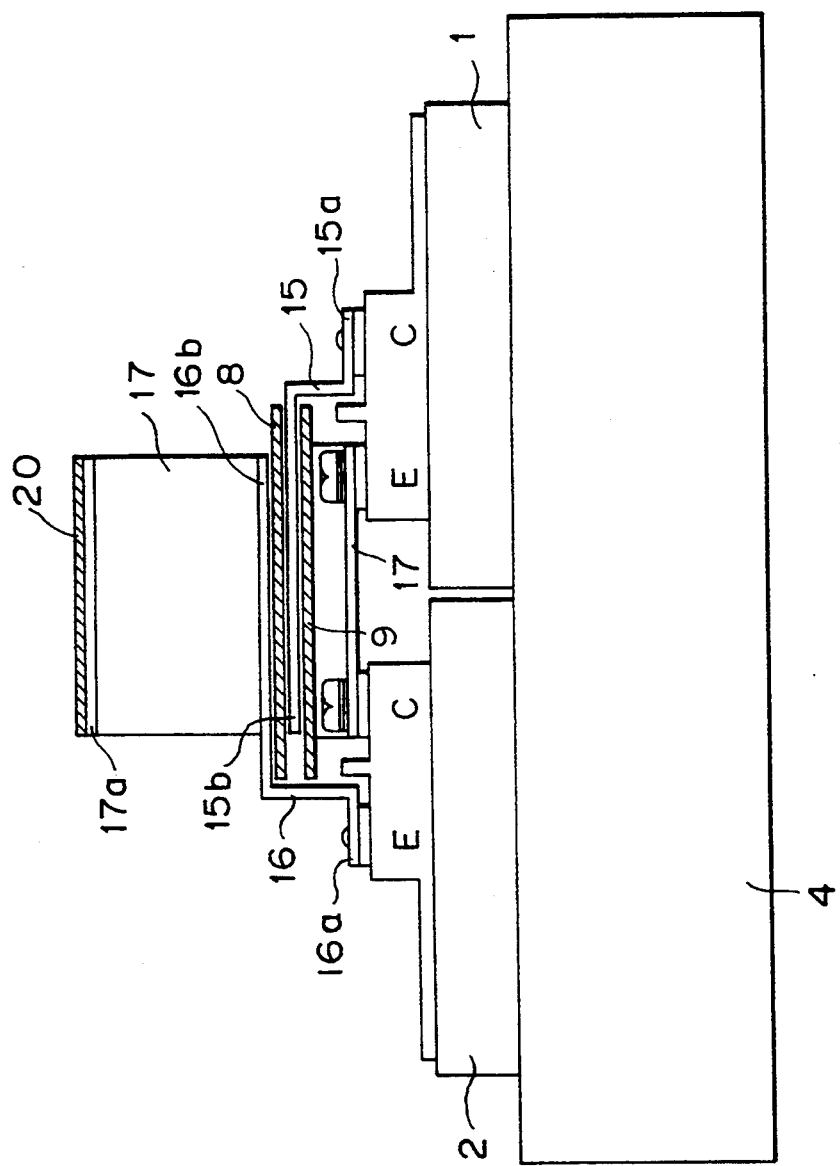
FIG. 9 is a sectional view taken along the line B—B of FIG. 8.

FIGS. 7 to 9 illustrate the embodiment of the first aspect of the present invention. FIG. 7 is a front view, partly omitted, of the inverter device of this embodiment. FIG. 8 is a sectional view taken along the line A—A of FIG. 7. FIG. 9 is a sectional view taken along the line B—B of FIG. 8. In these drawings, the reference numeral 1 denotes semiconductor switching elements for an upper arm, while 2 denotes semiconductor switching elements for a lower arm, and both types of semiconductor switching elements are arranged in parallel on a cooling member 4. To a positive side input terminal of each element 1 is connected one of the outside flat surfaces, 15a, of a positive side short-circuiting bar 15 which is a conducting plate bent so as to have a crank-shaped cross section.

To a negative side input terminal of each element 2 is similarly connected one of the outside flat surfaces, 16a, of a negative side short-circuiting bar 16 which is a conducting plate bent so as to have a crank-shaped cross section. To output terminals of the elements 1, 2 is connected an output side short-circuiting bar 17 comprising a plate whose end in the longitudinal direction is bent so as to have an L-shaped cross section.

As shown in FIG. 9, the other outside flat surface 15b of the short-circuiting bar 15 is located above the output side short-circuiting bar 17, while the other outside flat surface 16b of the short-circuiting bar 16 is superimposed, in close proximity, on top of the outside flat surface 15b of the short-circuiting bar 15 via an insulating sheet 8. To the bottom of the outside flat surface 15b of the short-circuiting bar 15 is bonded an insulating sheet 9, thereby to ensure insulation from the output side short-circuiting bar 17.

The right ends of the short-circuiting bars 15, 16 (FIG. 8) are each connected to a smoothing capacitor 3 (not shown) to constitute a direct current circuit portion. This smoothing capacitor 3 is disposed laterally in proximity to the longitudinal extension of the elements 1, 2 which are arranged in parallel in two rows parallel to each other.

As shown in FIG. 7, the output side short-circuiting bar 17 has an end portion 17a formed by being bent at its upper left portion. Bolted at the end portion 17a to a bar 20 extending toward the smoothing capacitor 3, the output side short-circuiting bar 17 constitutes an output circuit portion. The front end of the bar 20 becomes an outside output terminal, although not shown.

In this embodiment, the short-circuiting bars 15, 16 are superimposed on each other via the insulating sheet 8 on planes above the parallelly arranged elements 1, 2. Thus, the difference in wiring inductance at turn-on between the closest element to and the farthest element from the smoothing capacitor 3 is reduced, and the imbalance of current is decreased.

In detail, when the device is switched on, wiring inductance becomes a transient resistance as stated previously. Hence, the imbalance of current arises among the elements 1, 2 depending on the magnitude of the wiring inductance. The present invention takes advantage of this fact, and constructs the short-circuiting bars 15, 16 as follows: Wiring inductance will be aggressively offset among the respective elements 1, 2, whereby the absolute value of the wiring inductance will be minimized and the difference in wiring inductance among the elements 1, 2 will be minimized.

Consequently, the present embodiment can accomplish a large-capacity inverter device with a satisfactory current balance even when the smoothing capacitor 3 is in lateral relationship with the arrangement of the elements 1, 2. Furthermore, it involves a simple bar structure, and has a small number of components, enabling a small-sized, low-priced, stable-quality inverter device.

Even if the instant embodiment is to be expanded to a larger size with an increased number of semiconductor switching elements arranged in parallel, there is no need to change the basic configuration of the bars; a simple extension is sufficient for systematic designing. Thus, diversification of designing and production is facilitated.

The larger number of the elements are arranged in parallel, the more heat is generated. However, the structure of the short-circuiting bars according to this embodiment permits the connection of the elements 1, 2 arranged uniformly in a balanced manner on the surface of the cooling member 4. This contrivance can easily cope with the problem of heat buildup.

Embodiment 2

Figure 10:
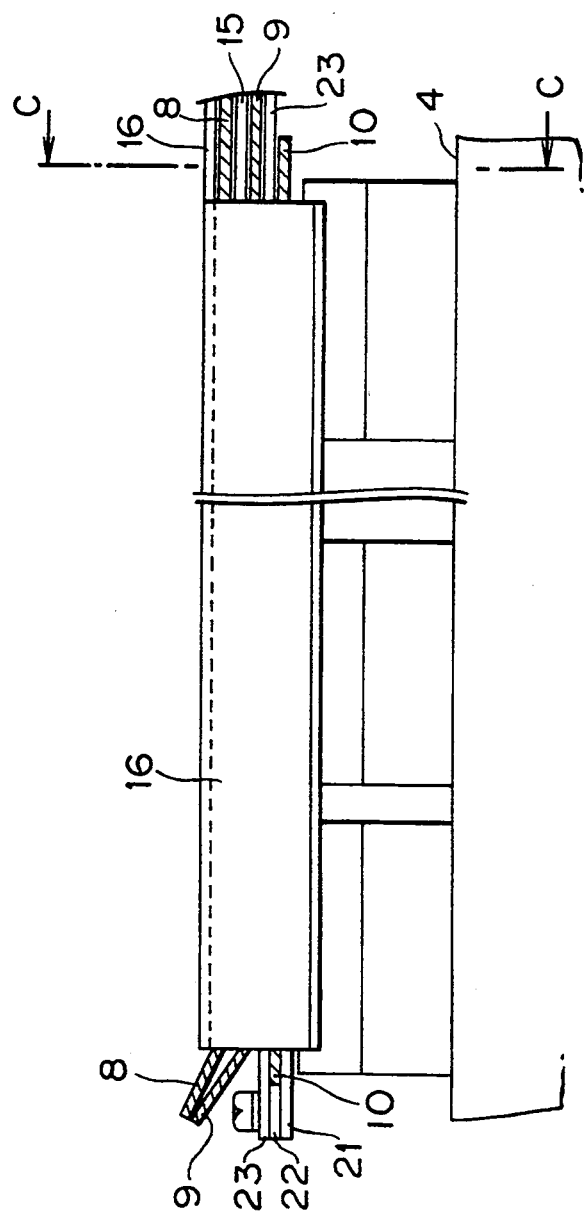
FIG. 10 is a side view, partly in cross section, of an inverter device as an embodiment of the second aspect of the present invention.
Figure 11:
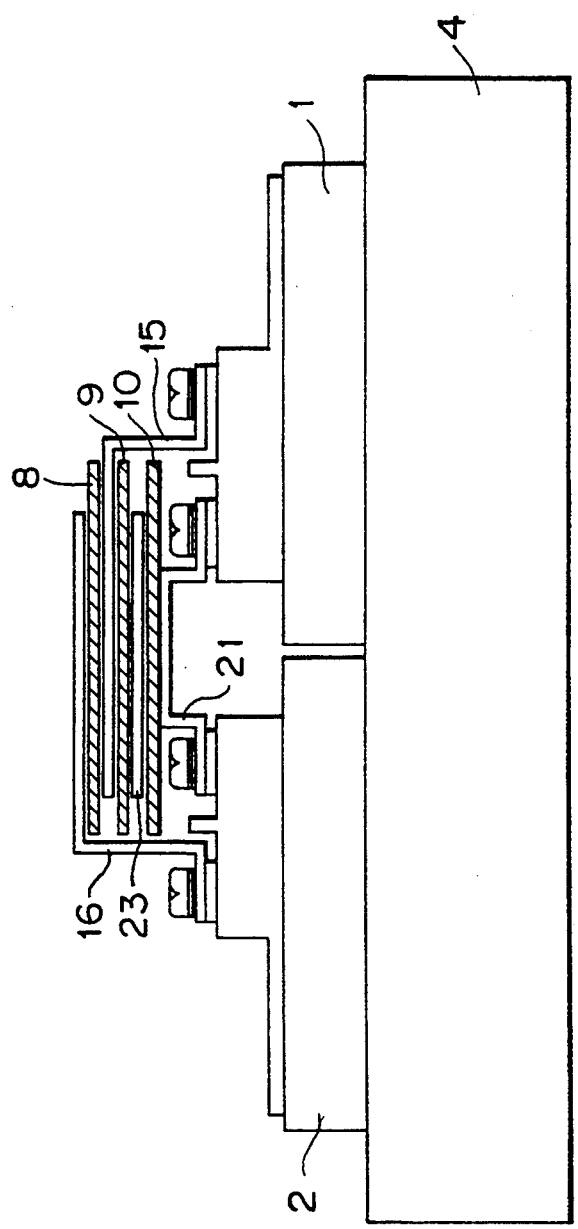
FIG. 11 is a sectional view taken along the line C—C of FIG. 10.

FIG. 10 is an appearance view showing an embodiment of the second aspect of the present invention. FIG. 11 is a sectional view taken along the line C—C of FIG. 10. This embodiment has the entire construction in common with the embodiment of the first aspect of the present invention. Therefore, only its differences from the latter embodiment will be explained, and an explanation for the portions common to both embodiments will be omitted with the same reference numerals being attached.

In the drawings, an output side short-circuiting bar 21 is a conducting plate bent so as to have a hat-shaped cross section. It is joined to semiconductor switching elements 1, 2 by means of a bolt such that its central convex portion is situated above. At the left end of the output side short-circuiting bar 21 in FIG. 10, i.e. the end portion on the side opposite to the side where a smoothing capacitor 3 is disposed, the output side short-circuiting bar 21 is joined to an output bar 23 via a spacer 22 by means of a bolt.

The output bar 23 is disposed between the short-circuiting bar 21 and the short-circuiting bar 15 in parallel to them, toward the smoothing capacitor 3, starting with its junction to the output side short-circuiting bar 21. At this time, the output bar 23 and the short-circuiting bar 15, as well as the output bar 23 and the short-circuiting bar 21 are insulated from each other by an insulating sheet 9 and an insulating sheet 10, respectively, bonded to the output bar 23. The short-circuiting bar 21 is thus turned after it is taken out to the side opposite to the side where the smoothing capacitor 3 is disposed. Then, a wiring is laid on the smoothing capacitor 3 side between the short-circuiting bars 16, 15 and the short-circuiting bar 21 superimposed on each other in parallel relationship, whereby the short-circuiting bars 16, 15, 21 and the output bar 23 are closely stacked via the insulating sheets 8 to 10, respectively.

Figure 12:
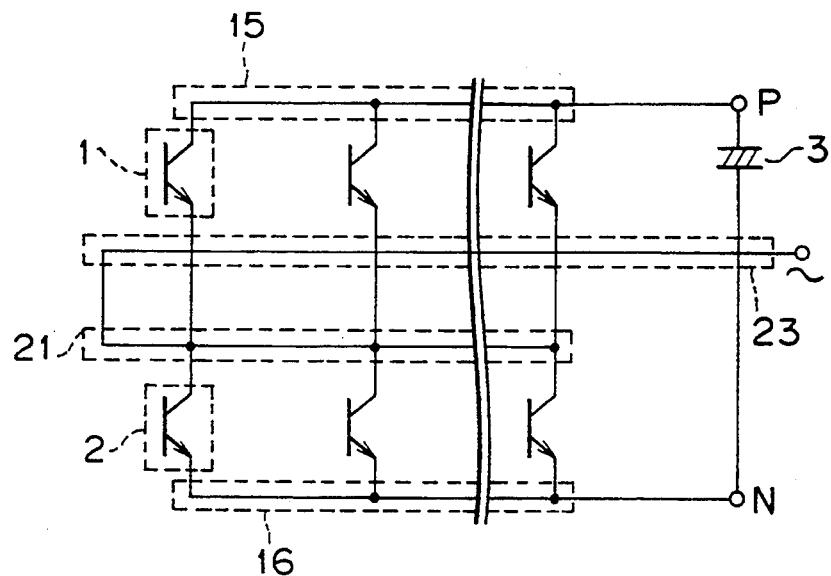
FIG. 12 is a circuit diagram showing the construction of the inverter device as the embodiment of the second aspect of the present invention.
Figure 13:
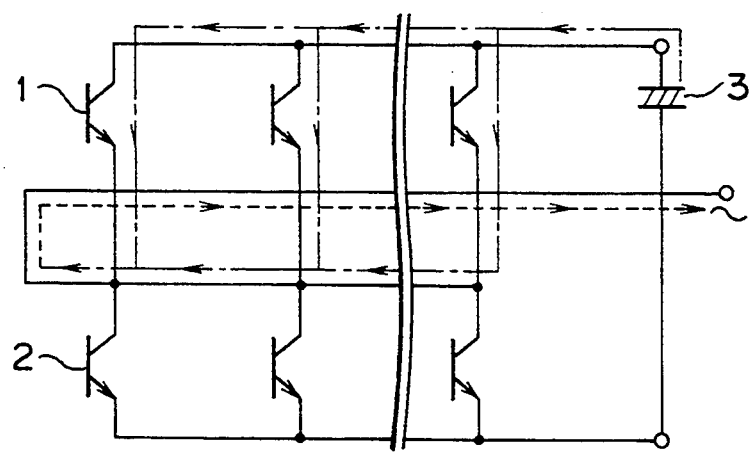
FIG. 13 is a circuit diagram showing the actions of the inverter device as the embodiment of the second aspect of the present invention.

As a result, the short-circuiting bars 16, 15, 21 and the output bar 23 for the elements 1, 2 are disposed in parallel to each other, as illustrated in FIG. 12. When current flows constantly, total current is shunted into the respective elements and merged again, as shown in FIG. 13. The arrows on the broken line in the drawing represent total current, and the arrows on the one-dot chain line represent the shunt currents of the respective elements.

Because of this construction, wiring inductance can be offset uniformly more effectively than in the embodiment of the first aspect of the invention.

Furthermore, a spike voltage occurs at switch-on because of the energy of wiring inductance of the direct current intermediate circuit. In the present embodiment, wiring inductance is uniformly offset among the respective elements, and thus, the occurrence of spike voltage is suppressed.

Embodiment 3

Figure 14:
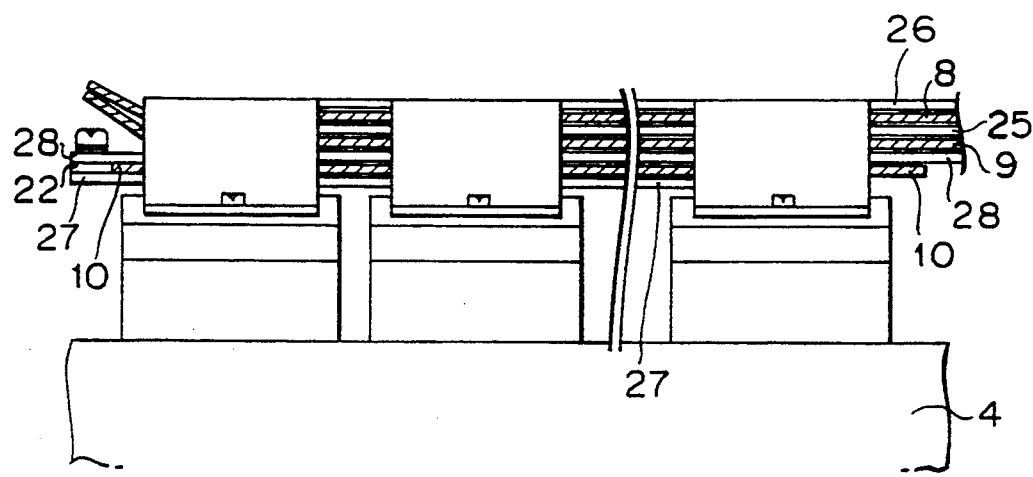
FIG. 14 is a side view, partly in cross section, of an inverter device as an embodiment of the third aspect of the present invention.
Figure 15:
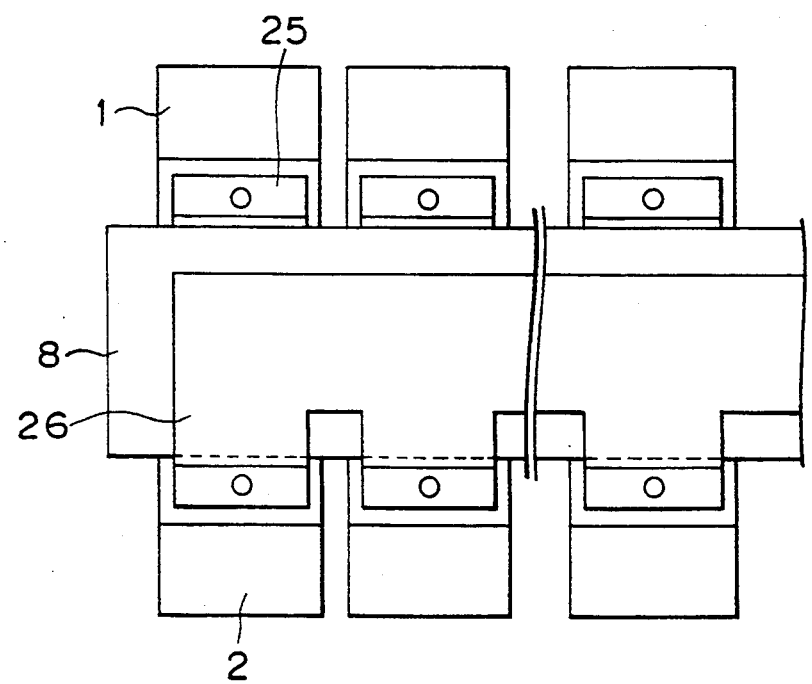
FIG. 15 is a plan view of the device illustrated in FIG. 14.

FIG. 14 is an appearance view showing an embodiment of the third aspect of the present invention. FIG. 15 is a plan view of FIG. 16. This embodiment has the entire construction in common with the embodiment of the second aspect of the present invention. Therefore, only its differences from the latter embodiment will be explained, and an explanation for the portions common to both embodiments will be omitted with the same reference numerals being attached.

In the drawings, a positive side short-circuiting bar 25, a negative side short-circuiting bar 26, an output side short-circuiting bar 27, and an output bar 28 stacked in 4 layers via insulating sheets 8, 9, 10 are formed so as to have a comb-like appearance in which their widthwise outside portions among parallelly arranged semiconductor switching elements are notched.

FIGS. 16A, 16B, 16C show the state of a single short-circuiting bar 26, in which FIG. 16A is a front view of the short-circuiting bar 26, FIG. 16B is a plan view thereof, and FIG. 16C is a side view of FIG. 16B.

FIGS. 17A, 17B, 17C show the state of a single short-circuiting bar 27, in which FIG. 17A is a front view of the short-circuiting bar 27, FIG. 17B is a plan view thereof, and FIG. 17C is a side view of FIG. 17B.

The dimensions of the notches of the short-circuiting bars 26, 27 and the output bar 28 (not shown) are formed in a similar way. Thus, when these bars are stacked, the shapes of the notches are consistent.

In the instant embodiment, wiring inductance is a shape-dependent value. Hence, the bars are shaped like a comb and stacked, and the flow of an electric current across each bar is concentrated in the middle of the bar, whereby the offsetting of the wiring inductance can be performed more effectively than in the embodiment of the second aspect of the present invention.

As described above, according to the first aspect of the present invention, the two short-circuiting bars of the direct current circuit portion are each formed of a conducting plate bent so as to have a crank-shaped cross section, one of the outside flat surfaces of each of the two conducting plates is connected to the input end of each semiconductor switching element, and the other outside flat surfaces of the respective conducting plates are superimposed on each other, in close proximity, via an insulator. This contrivance reduces the difference in wiring conductance between the closest element to and the farthest element from the smoothing capacitor when the device is turned on, and also decreases the current imbalance between them. Consequently, the balance in electric current is improved, and the number of components becomes small, thus accomplishing a large-capacity, small-sized, low-priced inverter device. Even when the number of the elements arranged in parallel increases, the device can be designed and assembled efficiently with a stable quality, since the basic configuration is common to the respective short-circuiting bars.

According to the second aspect of the invention, the short-circuiting bar of the output circuit portion is extended to the side opposite to the side where the smoothing capacitor is located, and the extended end of the short-circuiting bar is inverted and bent upwards, and the short-circuiting bar of the output circuit portion and the two short-circuiting bars of the direct current circuit portion are closely disposed parallel to each other with insulators therebetween. Because of this construction, the difference in wiring inductance is further decreased, and imbalance in current becomes less.

According to the third aspect of the invention, those portions of the short-circuiting bars excluding their junctions to the semiconductor switching elements are notched in the width direction, whereby the short-circuiting bars are formed in a comb-like shape. Hence, currents are concentrated in the middle of the short-circuiting bars, so that the wiring inductance is offset more effectively. This construction makes current balance even better.

The present invention has been described in detail with respect to preferred embodiments, and it will now be clear that changes and modifications may be made without departing from the invention in its broader aspects, and it is our intention, therefore, in the appended claims to cover all such changes and modifications as fall within the true spirit of the invention.

What is claimed is:

1. An inverter device comprising:
   an arrangement of a plurality of semiconductor switching elements connected in parallel in each phase to constitute an upper arm and a lower arm of a bridge circuit, said arrangement having a longitudinal extension,
   a smoothing capacitor disposed laterally in proximity to the longitudinal extension of the parallel-connected semiconductor switching elements,
   a direct current circuit portion comprising two short-circuiting bars connecting both ends of the smoothing capacitor to the input ends of the respective semiconductor switching elements, and
   an output circuit portion comprising a short-circuiting bar connecting the output ends of the semiconductor switching elements to an output terminal; wherein
   the two short-circuiting bars of the direct current circuit portion are each formed of a conducting plate bent so as to have a crank-shaped cross section having outside flat surfaces,
   one of the outside flat surfaces of each of the two conducting plates is connected to the input end of each semiconductor switching element, and
   the other outside flat surfaces of the respective conducting plates are superimposed on each other, in close proximity, via an insulator.

2. An inverter device as claimed in claim 1, wherein the short-circuiting bar of the output circuit portion has an end extended to the side opposite to the side where the smoothing capacitor is located, and the extended end of the short-circuiting bar is inverted and bent upwards, and the short-circuiting bar of the output circuit portion and the two short-circuiting bars of the direct current circuit portion are closely disposed parallel to each other with insulators therebetween.

3. An inverter device as claimed in claim 1, wherein those portions of the short-circuiting bars excluding their junctions to the semiconductor switching elements are notched in the width direction, whereby the short-circuiting bars are formed in a comb-like shape.

4. An inverter device as claimed in claim 2, wherein those portions of the short-circuiting bars excluding their junctions to the semiconductor switching elements are notched in the width direction, whereby the short-circuiting bars are formed in a comb-like shape.

* * * * *